US007221162B2

(12) United States Patent
Feiweier et al.

(10) Patent No.: US 7,221,162 B2
(45) Date of Patent: May 22, 2007

(54) RF TRANSMITTER ARRANGEMENT FOR AN MR SYSTEM, AND METHOD FOR DETERMINING A SETTING PARAMETER THEREFOR

(75) Inventors: Thorsten Feiweier, Poxdorf (DE); Ralph Oppelt, Uttenreuth (DE); Wolfgang Renz, Erlangen (DE); Markus Vester, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/993,644

(22) Filed: Nov. 19, 2004

(65) Prior Publication Data

US 2005/0140369 A1 Jun. 30, 2005

Related U.S. Application Data

(60) Provisional application No. 60/523,100, filed on Nov. 19, 2003.

(30) Foreign Application Priority Data

Nov. 20, 2003 (DE) ................................ 103 54 227
Nov. 8, 2004 (DE) ...................... 10 2004 053 777

(51) Int. Cl.
*G01V 3/00* (2006.01)

(52) U.S. Cl. ...................................... 324/318; 324/322

(58) Field of Classification Search ..................... None
See application file for complete search history.

(56) References Cited

U.S. PATENT DOCUMENTS 5,194,811 A * 3/1993 Murphy-Boesch et al. . 324/322
5,281,918 A 1/1994 Lehr .......................... 324/318
5,757,187 A * 5/1998 Wollin ........................ 324/306
6,040,697 A * 3/2000 Misic ......................... 324/318
6,043,658 A * 3/2000 Leussler ..................... 324/318
6,396,273 B2 * 5/2002 Misic ......................... 324/318
6,411,090 B1 6/2002 Boskamp .................... 324/318
6,608,480 B1 * 8/2003 Weyers ....................... 324/318
6,714,013 B2 * 3/2004 Misic ......................... 324/318
6,768,302 B2 7/2004 Vester ........................ 324/307
6,900,636 B2 * 5/2005 Leussler ..................... 324/318
6,995,561 B2 * 2/2006 Boskamp et al. ........... 324/318

(Continued)

FOREIGN PATENT DOCUMENTS

DE OS 197 02 256 7/1998

(Continued)

*Primary Examiner*—Diego Gutierrez
*Assistant Examiner*—Tiffany A. Fetzner
(74) *Attorney, Agent, or Firm*—Schiff Hardin LLP

(57) ABSTRACT

A radio frequency transmitter arrangement for a magnetic resonance apparatus has a distribution unit and an antenna unit, wherein the antenna unit, to generate radio frequency fields, is fashioned in at least two orthogonal modes, and the distribution unit is fashioned for the division of an RF transmission signal into at least two mode feed signals. At least one adjustment unit is provided to adjust the amplitude and/or phase of one of the mode feed signals and is connected with the antenna unit such that each of the mode feed signals generates a radio frequency field in one of the modes. A multiple transmitter arrangement has at least two radio frequency transmitter arrangements and at least two 180° hybrids. A method is provided to determine at least one setting parameter of the adjustment unit.

7 Claims, 8 Drawing Sheets

U.S. PATENT DOCUMENTS

| | | | | |
|---|---|---|---|---|
| 7,012,430 | B2 * | 3/2006 | Misic | 324/318 |
| 2003/0062894 | A1 * | 4/2003 | Vester | 324/307 |
| 2003/0184293 | A1 * | 10/2003 | Boskamp et al. | 324/318 |
| 2004/0155656 | A1 * | 8/2004 | Leussler | 324/318 |
| 2004/0155657 | A1 * | 8/2004 | Misic | 324/318 |
| 2005/0140369 | A1 * | 6/2005 | Feiweier et al. | 324/318 |

FOREIGN PATENT DOCUMENTS

| | | |
|---|---|---|
| EP | 1 279 968 | 1/2004 |

* cited by examiner

1C
RF TRANSMITTER ARRANGEMENT
DISTRIBUTION UNIT
3C
25
9D
9E
9F
9G
11C
11D
11E
33
ADJUSTMENT UNIT
M=
0 0° 0° 0° 0° 0° 0° 0° 0°
1 0° 45° 90° 135° 180° 225° 270° 315°
2 0° 90° 180° 270° 0° 90° 180° 270°
3 0° 135° 270° 45° 180° 315° 90° 225°
4 0° 180° 0° 180° 0° 180° 0° 180°
5 0° 225° 90° 315° 180° 45° 270° 135°
6 0° 270° 180° 90° 0° 270° 180° 90°
7 0° 315° 270° 225° 180° 135° 90° 45°
DISTRIBUTION NETWORK
15A
BUTLER MATRIX
21
22
23

SLICE MEASUREMENTS
(B₁ MAP ENTRIES OUTLINED IN BOLD)

Average flip angle:
$90° \cdot 0.5 = 45°$

| 47° | 35° | 20° |
|---|---|---|
| 60° | 47° | 30° |
| 75° | 60° | 47° |

$\cdot 1.0/0.5$ SCALING FACTOR

| 94° | 60° | 40° |
|---|---|---|
| 120° | 94° | 60° |
| 150° | 120° | 94° |

Average flip angle:
$90°$

| 90° | 61° | 35° |
|---|---|---|
| 118° | 90° | 61° |
| 146° | 118° | 90° |

Average flip angle:
$90° \cdot 1.5 = 135°$

| 132° | 90° | 45° |
|---|---|---|
| 165° | 132° | 90° |
| 207° | 165° | 132° |

SCALING FACTOR $\cdot 1.0/1.5$

| 88° | 60° | 30° |
|---|---|---|
| 110° | 88° | 60° |
| 138° | 110° | 88° |

B₁ MAP

| 90° | 60° | 30° |
|---|---|---|
| 120° | 90° | 60° |
| 150° | 120° | 90° |

RF TRANSMITTER ARRANGEMENT FOR AN MR SYSTEM, AND METHOD FOR DETERMINING A SETTING PARAMETER THEREFOR

RELATED APPLICATION

This application claims the benefit of U.S. Provisional Application No. 60/523,100 filed Nov. 19, 2003.

BACKGROUND OF THE INVENTION

1. Field of the Invention

The present invention concerns a radio frequency transmitter arrangement and multiple transmitter arrangement for a magnetic resonance system as well as method to determine a setting parameter of such a transmitter arrangement.

2. Description of the Prior Art

Magnetic resonance (MR) tomography is a technique to acquire images of the inside of the body of a living examination subject. An examination subject is exposed to an optimally homogenous static basic magnetic field (designated as a B0 field) that is generated by a basic field magnet of an MR apparatus. During the acquisition of the MR images, rapidly switched gradient fields, generated by gradient coils, are superimposed on this basic magnetic field for spatial coding.

RF energy pulses of a defined field strength are subsequently radiated into the examination subject with radio frequency antennas (RF antennas). The magnetic flux density of these RF pulses is typically designated B1; the pulse-shaped radio frequency field is generally also called the B1 field for short. MR signals are triggered in the examination subject by the RF pulses and are acquired by RF reception antennas.

An example of a combined RF transmission-reception antenna is what is known as a bandpass birdcage resonator as described in German OS 187 02 256. This has sub-antennas (individual rods) with couplings among one another being partially cancelled by suitable technical measures (overlapping, mutual capacitors, transformers). Variable passive power distribution networks and/or a number of separately activatable radio frequency power amplifiers can be used for the optimization of the radiated B1 field with regard to, for example, homogeneity and power loss. The sub-antennas in the prior art are typically used as location-dependent transmitters.

U.S. Pat. No. 6,411,090 describes RF activation of such a birdcage resonator. The signal of an RF source is distributed to the sub-antennas of the birdcage resonator via a power distributor, a phase shifter and a number of amplifiers. The phase shifter effects an equal phase shift of the signal over a number of sub-antennas.

An arrangement to generate radio frequency fields in the examination volume of an MR apparatus is known from European Application 1 279 968. Resonator segments are thereby used that are electromagnetically decoupled from one another by means of capacitors connected in series, such that a separate transmission channel, via which the radio frequency infeed into the appertaining resonator segment ensues, can be associated with each resonator segment. Because the phase and the amplitude of the RF-infeed can be individually predetermined for each resonator segment, the arrangement enables a nearly complete control of the RF field distribution in the examination volume.

German OS 101 48 445 specifies the use of a Butler matrix to receive RF signals by means of the sub-antennas of a birdcage resonator from a reception volume of an MR apparatus. The (sub-antenna) reception signals are combined with one another into a basic combination and into a number of additional combinations. The goal is an optimized signal-to-noise ratio. The improvement is independent of the frequency and the B0 field strength. German OS 101 48 445 additionally explains that the Butler matrix can act as a distribution element for a transmission signal emitted by a transmitter and supplied to the Butler matrix. Upon being fed into a lowermost row of the Butler matrix, a magnetic resonance excitation signal (B1 field) with a substantially location-independent excitation intensity is generated.

A Butler matrix as a special design of a matrix feed system as explained in detail, for example, in "Taschenbuch der Hochfrequenztechnik", Meinke-Gundlach, 4th edition (1986), page N64.

The MR images of the examination subject are finally created based on received MR signals. The strength of the MR signals is also dependent on, among other things, the strength of the radiated B1 field. Temporal and spatial oscillations in the field strengths of the excited B1 field lead to unintended changes in the received MR signal that can falsify the measurement result. An inhomogeneous spatial distribution of the amplitude of the B1 field, for example, causes an unwanted dependency of the image contrast on the spatial position. This results from a superimposition of the intensity dependency (caused by the inhomogeneous field distribution) with the intensity distribution, which is determined at the respective location by the tissue material, and which contains the actual desired image information.

One reason for the oscillation in the radiated B1 field distribution eddy currents arising in the patient due to the B1 field. This is an unpreventable part of the coupling of the sub-antennas of the mentioned birdcage resonator. Eddy currents occur particularly strongly at wavelengths of the radio frequency field that are in the range of the subject to be examined, i.e. in medical application, for example, at MR frequencies greater than 100 MHz.

If, in addition to the activation of the rods of a birdcage resonator, separate power amplifiers are used, their outputs leak RF power (some of which is reflected back). Due to the nonlinear dependency of the output impedances on the voltage, the output amplitudes can no longer be predicted by a linear superimposition model. Given large signal amplitudes in proximity to the modulation limits, unexpected distortion or even over-voltages can thus be created at power components.

In order to be able to account for such influence of the B1 field distribution, it would be very advantageous if the B1 field could be quantitatively determined and subsequently radiated with corresponding compensation.

Various methods to determine the B1 field are known. As an example, in a technique known as transmitter adjustment the B1 field is determined by the resulting flip angle, using a double-echo RF pulse sequence.

SUMMARY OF THE INVENTION

An object of the present invention is to provide a radio frequency transmitter arrangement and a multiple transmitter arrangement, as well as a method to adjust such a transmitter arrangement, that allow inhomogeneities in the radio frequency transmission field to be minimized.

This object is inventively achieved by a radio frequency transmitter arrangement for a magnetic resonance system with a distribution unit and an antenna unit wherein the antenna unit generates radio frequency fields in at least two orthogonal modes and wherein the distribution unit divides the RF transmission signal into at least two mode feed signals, and having at least one adjustment unit for the adjustment of amplitude and/or phase exhibits [sic] at least one of the mode feed signals that is connected with the antenna unit such that each of the mode feed signals generates a radio frequency field in one of the modes.

In the operation of a radio frequency arrangement according to the invention, a radio frequency field can be emitted in the magnetic resonance apparatus by the antenna unit in at least two modes. As used herein a "mode" means a characteristic, spatial magnetic field distribution of a magnetic field radiated with the same hardware (antenna unit), the magnetic field distribution being given by the amplitude and phase of the magnetic field at each location in a transmission volume. It is advantageous for the invention when the modes essentially exhibit an equal polarization. "Characteristic" means that two modes do not have the same spatial field distribution. A mode designated in the following as a basic mode exhibits, for example, a significantly spatially homogenous (amplitude and phase) field distribution with an optimally uniform polarization. At least one higher mode (also designated in the following as an auxiliary mode) essentially exhibits a different, i.e. spatially inhomogeneous amplitude distribution and/or phase distribution. For example, the modes differ in the degree of their symmetry. In the case of a birdcage resonator, there is, for example, a separate azimuthal symmetry for each mode, i.e. the modes exhibit different azimuthal spatial functions.

Each of the modes used is inventively fed with a radio frequency transmission signal (here designated as a mode feed signal) that determines the time curve of the excited field, for example in the form of an RF pulse sequence. The mode feed signal can thereby also exist as a set of signals that are identical up to a relative phase and are mutually supplied, for example, to the antenna element of an antenna unit fashioned as a birdcage resonator in order to generate a mode in the transmission range.

For example, the distribution unit generates from a radio frequency transmission signal a plurality of mode feed signals whose temporal magnetic field curve is identical and of which at least one is adjustable in terms of its maximum amplitude (intensity) and/or phase. Alternatively, signals could be generated with different time curves, in that, for example, weighting factors are varied or modulators are used. For example, a dynamic change between RF pulse sequences optimized for various slices can thereby be realized.

Alternatively, the mode feed signals are each individually generated from one radio frequency transmission signal. For this, the distribution unit comprises a plurality of inputs for radio frequency transmission signals.

The distribution unit is connected with the antenna unit such that the radio frequency transmission signal is emitted in various modes depending on the mode feed signal. The phase and amplitude relationship of the modes relative to one another is thereby given by at least one parameter (amplitude and/or phase) set by the adjustment unit. The amplitude and/or the phase are determined, for example, with regard to an optimally spatially homogenous intensity curve of the radiated radio frequency field acting in the patient. Knowledge of one of the relative phase relations of the modes relative to one another thus is sufficient. By an "acting" (intensity, radio frequency or magnetic) field curve means any magnetic field that results in the patient due to the radiated magnetic field and due to, for example, magnetic fields generated via eddy currents in the patient, and thus, for example, any magnetic field that enables magnetic resonance examinations.

In other words, a number of modes of an antenna unit are inventively supplied with power via the distribution unit. An advantage of the invention is that this is also directly possible when an examination subject is located in the magnetic resonance apparatus. The examination subject, for example, may generate an inhomogeneity due to eddy current effects given radiation in the basic mode. Given the presence of an examination subject the effective radiated field distributions of each mode are measured to reduce such inhomogeneities. Such an inhomogeneity is subsequently at least partially compensated by adjustment of the amplitude and/or the phase and via mutual radiation of a plurality of modes. This means that the previously mentioned, unavoidable coupling of the examination subject and antenna unit, which exists due to the eddy currents in the patient arising due to the antenna unit, can be at least partially compensated in the context of the super-imposable, inhomogeneous mode field distributions.

By the inventive use of orthogonal modes with different field distributions, when separate power amplifiers are used for the modes, leakage of RF power from the amplifier outputs can be substantially prevented and, given large signal amplitudes near the modulation limits of the amplifiers, unexpected distortion or over-voltages at the power components can be prevented as well.

A further advantage of the invention is that the cause of inhomogeneities in the magnetic resonance image is addressed by virtue of the B1 field being effectively optimally homogenously radiated dependent on the examination subject.

The decoupling of orthogonal modes under load in accordance with the invention is a significant advantage of the radio frequency transmitter arrangement according to the arrangement. In contrast to European Application 1 279 968, the invention uses orthogonal modes in the generation of the B1 field.

In European Application 1 279 968, the inputs of the resonator segments are decoupled from one another with matching selected reactances (capacitors). With this method, only the reactive component of the coupling impedance ($Z_{jk}=U_k/I_j$) can be compensated, which is also sufficient with a nearly unloaded resonator. However, if a patient (approximating a conductive cylinder) is introduced, there is the additional coupling via eddy current loops in the patient that are respectively seen by a number of transmitting and receiving channels. Due to the two-fold application of the induction set ($I_{antenna\,j}\rightarrow(90°)\rightarrow Y_{eddy}\rightarrow(\sim 0°)\rightarrow I_{eddy}\rightarrow(90°)\rightarrow U_{antenna\,k}$), the coupling impedance thereby introduced is essentially an effective resistance. Compensation thereof in the antenna itself is not practical, since it would in turn require the installation of more variable effective resistors that would also absorb a significant portion of the transmission power and would contribute to noise in the case of reception.

When a number of RF power amplifiers are connected to the transmission channels, they reciprocally leak significant amounts on these paths. The amplifiers typical today react very sensitively to power flowing back from the load, and the usable output capacity must be severely reduced in order to prevent a voltage or current overload of the power transistors. The sum of emitted feed voltage UF and return current UR typically may not exceed a predetermined maximum value Umax; for example, given UR=0.2 Umax (4% return capacity), only UF=0.8, thus 64% of the maximum capacity is still available.

The inventive use of orthogonal modes largely remedies this problem since the eddy current patterns induced by a specific mode again only induce antenna voltages with the same field pattern. There is thus no coupling between the input pairs of different modes, and the unwanted coupling of the various power transmitters is prevented. This is, in fact, not exactly true in the cases of a non-rotationally-symmetric load, however the error caused by the "cloverleaf shape" of the patient cross-section is much smaller. "Orthogonal modes" in this sense means modes that prevent unwanted couplings.

The above object also is inventively achieved by a multiple transmitter arrangement that has at least two such radio frequency transmitter arrangements and at least two 180° hybrids, each of the radio frequency transmitter arrangements having a birdcage resonator as an antenna unit the birdcage resonators being staggered in the axial direction. The 180° hybrids are respectively connected between one of the antenna units and one of the distribution units, such that an output of the distribution unit occupied with a mode feed signal is connected with one of the two inputs of the 180° hybrids, and one of the outputs of one of the 180° hybrids is connected with one of the antenna units. This has the advantage that a field homogenization can be implemented in the radial and the axial directions.

The above object also is inventively achieved by a method to determine at least one setting parameter of an adjustment unit of a radio frequency transmitter arrangement with a distribution unit and an antenna unit of a magnetic resonance apparatus as described above. First, an examination subject is positioned in a transmission volume of the magnetic resonance apparatus, and a magnetic resonance image is acquired with a first mode. A spatially dependent radio frequency field distribution of the first mode is determined from the magnetic resonance image. At least one further magnetic resonance image is acquired with one further mode. A spatially dependent radio frequency field distribution is determined for at least the second mode with the aid of the further magnetic resonance image. At least one setting parameter is determined by means of the radio frequency field distributions, such that given simultaneous supply of the first mode feed signal and at least one of the further mode feed signals to the antenna unit, an effective radio frequency field is generated that is optimized with regard to its homogeneity.

In an embodiment of the radio frequency transmitter arrangement, the distribution unit includes a distributor that divides the transmission signal into a basic transmission signal and at least one auxiliary transmission signal which are at outputs of the distributor, and at least one adjustment unit is connected with one of the at least two outputs of the distributor, such that amplitude and/or phase of the corresponding basic or auxiliary transmission signal can be adjusted. A more complex realization of the distributor is, for example, a node, starting from which the RF amplifiers are adjustably controlled.

An amplification of one of the basic or auxiliary transmission signals preferably occurs after the distributor, or after the adjustment unit. This has the advantage that the necessary radio frequency components are not severely loaded in the adjustment unit.

In an embodiment of the radio frequency transmitter arrangement, the distribution unit has a distribution network with at least two inputs and at least two outputs, each of the inputs being connected with one of the outputs of the distributor or the adjustment unit, and each signal that is present at one of the inputs is distributed on the inputs as a mode feed sign in a predetermined phase occupation, and that the antenna unit has a plurality of antenna elements that are respectively connected with the outputs of the distribution network.

By means of the distribution network, antenna elements of the antenna unit, for example antenna rods of a birdcage resonator, can be mutually activated such that the radio frequency transmission signal is emitted as a mode. In the birdcage resonator, a signal supply of the antenna elements is necessary with a phase relation that is fixed dependent on the mode. The basic transmission signal is distributed, for example, as a mode feed signal on the outputs with eight equally azimuthally-distributed antenna elements in the distribution network, such that a relative phase of 45° exists between each two adjacent antenna elements. The mode feed signals preferably generate the respective basic or auxiliary transmission signals of orthogonal modes that have the already-mentioned advantage of not coupling with one another.

If the modes are set as orthogonal modes without an examination subject, the modes are only approximate given the subsequent introduction of an examination subject (for example a patient), due to the resulting coupling via the tissue of the orthogonality. The significant characteristics of the field curves of the various modes remain, however, such that essentially no coupling of modes occurs (and therewith of the power amplifiers associated with them), so homogenization is possible.

In an embodiment of the radio frequency transmitter arrangement, the distribution network is fashioned such that the mode feed signals of the basic or auxiliary transmission signals respectively generate radio frequency fields that are circularly polarized in the same direction in an antenna unit fashioned as a birdcage resonator. An polarization over a region in the transmission volume increasing toward the edge becomes increasingly equalized with an increasing number of antenna rods.

In a further embodiment of the radio frequency transmitter arrangement, the distribution unit has a distribution amplifier that is connected with an output of the distributor or the adjustment unit.

In a preferred embodiment of the method, the first mode is acquired with an intrinsic T1-dependent measurement method, a distribution of the influence of T1 relaxation on magnetic resonance signals is distributed in the transmission volume, the spatially-dependent radio frequency field distribution of the first mode is determined dependent on the distribution of the influence of the T1 relaxation on the MR signals, and the spatially-dependent radio frequency field distribution of the second mode is determined with the aid of the further magnetic resonance image, and the distribution of the influence of the T1 relaxation on the MR signals is determined in the transmission volume.

An advantage of this embodiment that the spatially dependent spin relaxation in the tissue is taken into consideration. An intrinsic T1-dependent measurement method is, for example, the double-echo adjustment method or a method in which MR images are acquired at various time intervals from the transmission event. This T1 relaxation influences, for example, both echoes in the aforementioned (double-echo) transmitter adjustment, because the excited nuclear spins back (relax) again little by little to align with the basic magnetic field. The result is thereby adulterated. Via the tissue-dependent T1 relaxation, the measurable amplitude of the second echo is less by the factor $$e^{\frac{-t}{T1}}$$

than without a relaxation effect. T1-dependent methods can be T1-independent with higher measurement outlay, in particular, longer time. In the preferred embodiment, it is possible to largely compensate this disadvantage, because measurement effort is reduced to the one-time determination of the influence of a T1 relaxation on magnetic resonance signals in the transmission volume.

In other words, in the method according to the invention, the T1 dependency is advantageously determined only for the first mode and subsequently is transferred to the field distributions of the further mode(s). This saves significant time in the determination of the setting parameters (amplitude and/or phase of one of the mode feed signals). It is particularly advantageous for the first mode to be a type of basic mode that enables the determination of the T1 dependency essentially in the entire transmission range. Such a T1 map (spatially-dependent T1 information) can thus be used for field determination of modes in the most varied parts of the transmission volume.

In an embodiment of the method, the MR images are acquired with an identical reception configuration of the MR apparatus for the determination of the B1 profiles of the individual modes. This has the advantage that, in addition to the amount of the B1 field distribution, a phase distribution relative to this reception configuration can also be measured. If all distributions are measured with the same reception configuration, the relative phase relationship of the modes relative to one another is thus known.

DESCRIPTION OF THE PREFERRED EMBODIMENTS

Figure 1:
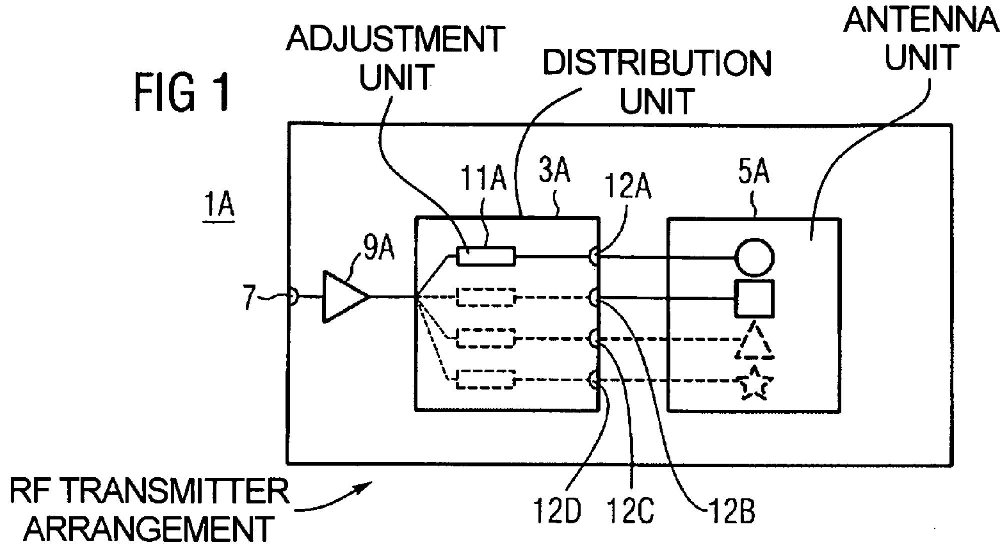
FIG. 1 schematically illustrates a radio frequency transmitter arrangement according to the invention, with a distribution unit and an antenna unit.

FIG. 1 schematically shows the design of a radio frequency transmitter unit 1A with a distribution unit 3A and an antenna unit 5A. The RF transmitter unit 1A has an input 7 that can be connected with a radio frequency source. The coupled signal is amplified with a radio frequency amplifier 9A before it is conducted to the distribution unit 3A.

The distribution unit 3A divides the transmission signal. One of the divided transmission signals (for example the basic transmission signal) proceeds through an adjustment unit 11A for amplitude and/or phase adjustment. The further (auxiliary) transmission signals preferably also are modified with regard to their phase and/or amplitude with adjustment units (indicated dashed). The distribution unit 3A provides at least two mode feed signals that are present at the outputs 12A, 12B, . . . The mode feed signals are conducted to the antenna unit 5A and generate radio frequency fields in a transmission (emission) volume of the antenna unit 5A. The radio frequency field that can be generated with only a single mode feed signal is designated as a mode. The various modes are schematically shown as a circle, quadrangle, and triangle . . . Modes that are orthogonal to one another are particularly advantageous. As an orthogonality condition for the electrical field vectors. $E_1$ and $E_2$ generated in the patient (having volume V, conductivity σ) by two such modes, the following should applies in pairs (and in the time average over the RF period):

$$\int \sigma\, E_1\, E_2 \text{ data value}=0$$

Under idealized conditions, the coupling between the mode inputs resulting from the tissue is equal to zero. In reality, patients are naturally neither homogenously conductive nor cylindrically symmetric, such that the modes are only approximately orthogonal, due to the eddy current fields. Nevertheless, such generated modes can allow an important improvement in the B1 field generation relative to the direct activation of the sub-antennas when, for example, the amplitudes and/or phases of radiated modes are selected with the aid of the adjustment unit(s) 11A, . . . such that, in the field, a number of superimposed modes, for example field minima of the basic mode, are filled by the auxiliary mode/auxiliary modes. An exemplary procedure is explained in context with FIG. 8.

Figure 2:
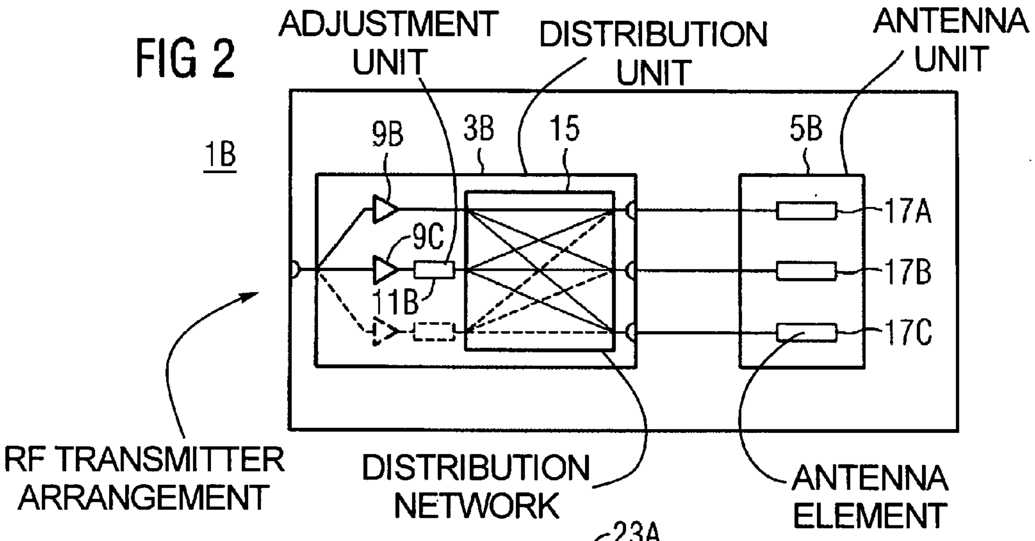
FIG. 2 schematically illustrates a further radio frequency transmitter arrangement according to the invention, with a distribution unit that comprises a distribution network.

FIG. 2 shows a further design for a radio frequency transmitter arrangement 1B according to the invention. The distribution unit 3B additionally has a distribution network 15. The amplification of the radio frequency signals ensues with radio frequency amplifiers 9B, 9C, . . . which are arranged in connection with the distribution of the radio frequency transmission signal on a number of transmission lines and before the distribution network 15. In this embodiment, one or more adjustment units 11B are connected downstream from the amplifiers 9B, 9C.

The amplified signals are fed into the distribution network 15. The signals at the inputs are distributed with fixed phases to the outputs of the distribution network 15. The outputs of the distribution network 15 are connected with antenna elements 17A, 17B, 17C of an antenna unit 5B. If the distribution network 15 is fed with only one input, for example by the adjustment units 11B or the power amplifiers 9B, 9C blacking all signals except for one of the distributed signals, in the distribution network 15 respective signals with different established phases are thus present at the outputs such that, for example, a characteristic radio frequency field (mode) can be radiated via the antenna elements 17A, 17B, 17C.

The amplifier units 9B, 9C, . . . can be designed with a capacity corresponding to the power needed in the various modes. This has the advantage that only the amplifier 9B, for example, need be designed to satisfy the capacities typical for the basic mode, in contrast to which the amplifiers 9C, . . . can be designed correspondingly smaller for the auxiliary modes.

Figure 3:
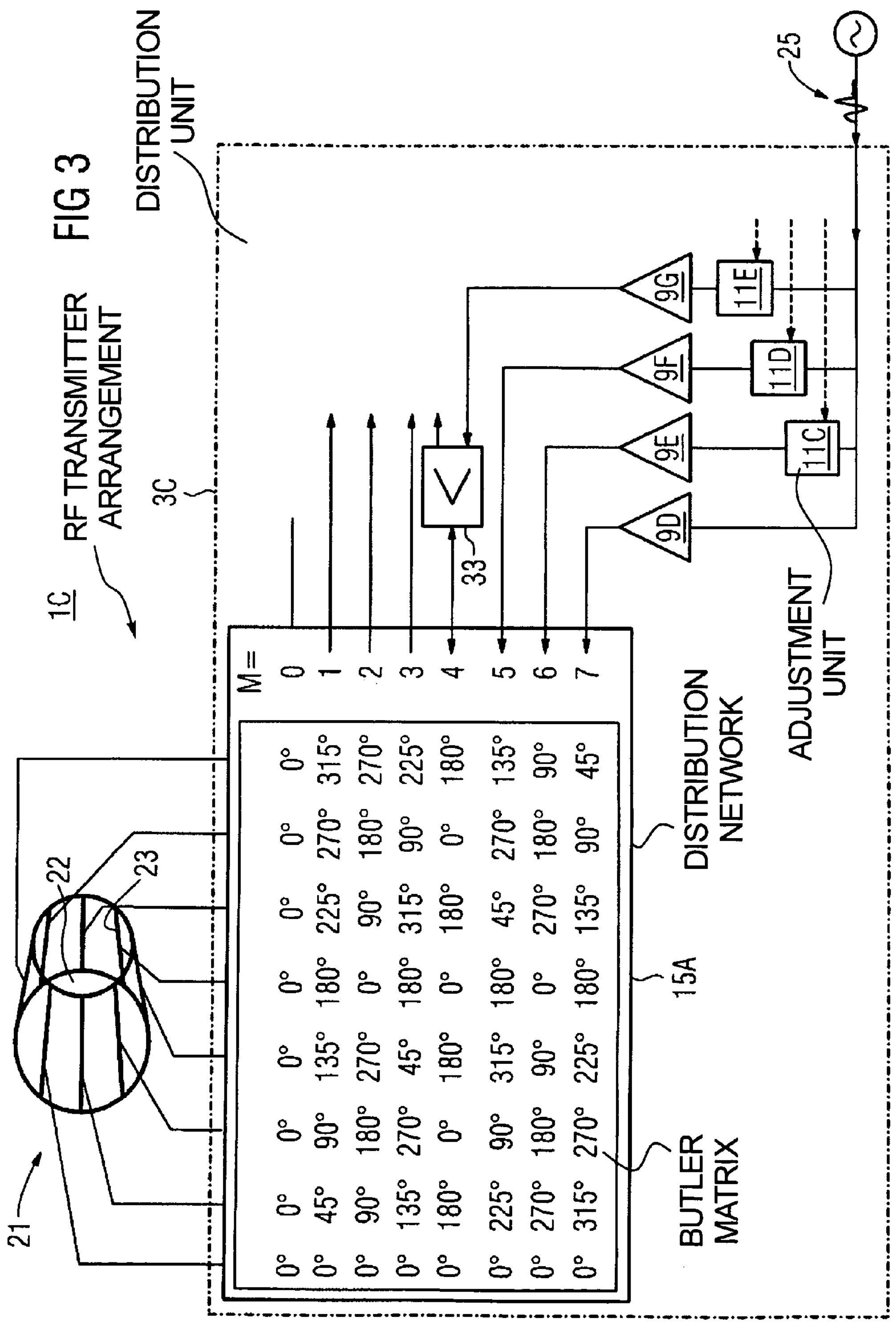
FIG. 3 is a more detailed illustration of a schema to clarify a radio frequency transmitter arrangement according to the invention, with a birdcage resonator and a distribution network.

FIG. 3 shows a radio frequency transmitter arrangement 1C with a birdcage resonator 21 as an antenna unit. The birdcage resonator 21 is an array antenna that has, for example, eight antenna elements 23 which are parallel to one another disposed around an axis of symmetry and enclose a transmission volume. In principle, the array antenna could have more or fewer antenna elements 23. Due to the number of the antenna elements 23, in FIG. 3 eight radio frequency signals are distributed to the antenna elements 23.

Upon transmission, meaning upon generation of a B1 field in the transmission volume, an RF transmission signal 25 of an RF signal source is fed into a distribution unit 3C. The RF transmission signal 25 is divided into a basic transmission signal and three auxiliary transmission signals. The auxiliary transmission signals respectively proceed though adjustment units 11C, 11D, 11E for the amplitude and phase adjustment. An adjustment unit also could be provided for the basic transmission signal. The adjustment units 11C, 11D, 11E are adjusted or set (dashed arrows) by means of control signals. The adjustment ensues, for example, according to the inventive method to determine at least one setting parameter.

The basic transmission signals and the auxiliary transmission signals proceed through subsequent radio frequency power amplifiers 9D, . . . , 9G. A Butler matrix 15A, analogous to Fourier transformation, effects the distribution of each of the basic transmission signals and auxiliary transmission signals to the antenna elements 23 for mode generation. The eight antenna outputs (antenna element outputs) are thereby connected with eight transmission-side and/or reception-side inputs or, outputs. An output designated with M=0 represents the identity implementation and is not used. Of the remaining seven inputs or outputs, the outputs M=1, 2, 3 are only used for reception, the output or input M=4 is used both for reception and for transmission, and the inputs M=5, 6, 7 are used only for transmission. Since the input M=4 can be used both for transmission and reception, a transmission-reception diplexer 33 is connected upstream therefrom.

The phase relation with which the antenna elements receive supplied RF signals is decisive for the azimuthal symmetry of the modes. The antenna elements 23 are inventively supplied with the RF signals via the Butler matrix 15A in the distribution network 15. The Butler matrix 15A has a number of delay and addition elements. An RF signal present at any of the inputs M=4, 5, 6, 7 is distributed to the antenna outputs with a fixed phase occupancy, such that one mode is associated with each of the inputs of the Butler matrix 15A used at the transmission side. This results from the phase relation of the antenna elements 23 to one another. The antenna elements thus do not act individually as spatially dependent transmitters, but rather they inventively, mutually (i.e., in combination) excite a mode via Fourier components.

The phase angles between adjacent antenna elements are specified in the Butler matrix 15A in FIG. 3. For the basic mode that is coupled in the input M=7, phase angles of 45° result for adjacent antenna elements 23. It thus forms an approximately homogenous mode in the transmission volume of the birdcage resonator 21.

The first auxiliary signal for the first auxiliary mode is coupled in the input M=6 and is distributed to the antenna elements 23. Adjacent antenna elements exhibit a phase relation of 90° in this first auxiliary mode, such that the rotational symmetry is broken. The input M=3 leads to phase differences of 135° and the input M=4 leads to phase differences of 180° for adjacent antenna elements. The input M=4 corresponds to significantly more linear polarization, in contrast to which the inputs M=5, 6, 7 essentially correspond to more circular polarization. They exhibit a rotational direction counter to the circular polarization of the reception fields M=1, 2, 3.

The specified delays of the individual Butler matrix elements relate to the Larmor frequency. The delays clearly correspond to an analogous Fourier transformation of the transmission signals. It is thereby ensured that the RF signals present at the inputs generate modes in the "empty" (patient-free) transmission volume that are orthogonal to one another.

Alternatively, the combination network can be used to receive MR signals. The antenna outputs 12A, . . . thereby serve as inputs in the distribution unit. The signals received with the antenna elements are combined in the distribution network into modes which are then supplied to the image processing.

In the following, the modes are explained using their field structures in cylindrical coordinates r, ϕ and z. For the birdcage resonator 21 with radius R, for a mode m the currents through the antenna elements 23 exhibit the following azimuthal angle dependency:

$$I(\phi)=\exp(jm\phi).$$

For a field distribution of these MR-effective circular components inside a long resonator (length>diameter) with continuous current distribution (i.e. very many rods), it is then true that $$B1(r,\ \phi)=r\hat{}(m-1)*\exp(j(m-1)\phi).$$

The field of all modes m is overall purely circularly polarized. A homogenous B1 field results for m=1.

The field falls of outside of the current-conducting cylinder proportional to r^−(m+1) and exhibits an opposite rotational direction.

The field structure is also approximately true for a short resonator, but an additional r- and z-dependency then comes into consideration, because the field can slowly fall off on the z-axis beyond the resonator and can increase with r (nearing the currents). The following approximation formulas describe the field, whereby a is a constant dependent on birdcage length and diameter:

$$B1_{short}(r,z)\sim B1(\mathrm{r})*(1-a*z\hat{}2+a/2*r\hat{}2)$$

For an antenna element-by-antenna element analysis of the current distribution with a final antenna element count (for example N=8), the field formula is no longer exactly true. Rather, in addition to the desired spatial frequency (for example m=1), the aliasing products (m' modulo N=m, thus for example m'= . . . −15, −7, 9, 17) are also excited. For very thin antenna rods (filament currents), all aliasing excitations have the same amplitudes at the edge. Due to the power r^(m−1), they are, however, only significant near the rods and there produce amplitude lobes and thus an interference with the circularity. In the immediate proximity of a rod, the field is nearly linearly polarized. Given a final number of antenna elements 23, modes are thus not individually excited but rather are always excited with their aliasing products. These separately excitable sets of modes are again significantly orthogonal to one another and likewise allow a homogenization of the B1 field.

The current division is also the reason why, given eight antenna elements, the modes m=4 and m=−4 are not able to be differentiated: the rods have only phases of 0° and 180° without intermediate values; therefore all currents and fields are zero at a quarter-period after the maximum. There is correspondingly a linearly-polarized field that exhibits both left and right circular contributions and thus can be used for transmission as well as for reception.

An advantage of the radio frequency transmitter arrangement specified in FIG. 3, and of the inventive multiple transmitter arrangement in general, is the hierarchical expandability of the number of the basic and auxiliary transmission signals used. Given an individual activation of, for example, eight antenna elements, eight transmission outputs are also (also without eddy current effects) necessary for the generation of a homogenous field. In the mode concept according to the invention, however by contrast one can begin with only one strong transmission signal for the basic mode and then, depending on requirements for the field quality, add an arbitrary number of further auxiliary transmission signals for higher modes; the transmission signals can originate from one or from more RF signal sources. Since the patient power losses for the higher auxiliary modes are for the most part clearly smaller, these auxiliary transmission signals can be weaker. Corresponding to the use of the network proposed in German OS 101 48 455, given transmission a halving of the necessary transmitters can thus be enabled with practically unreduced RF field quality. This is an important advantage of the invention since it leads to a more cost-effective activation, for example of array antennas such as the birdcage resonator.

Figure 4:
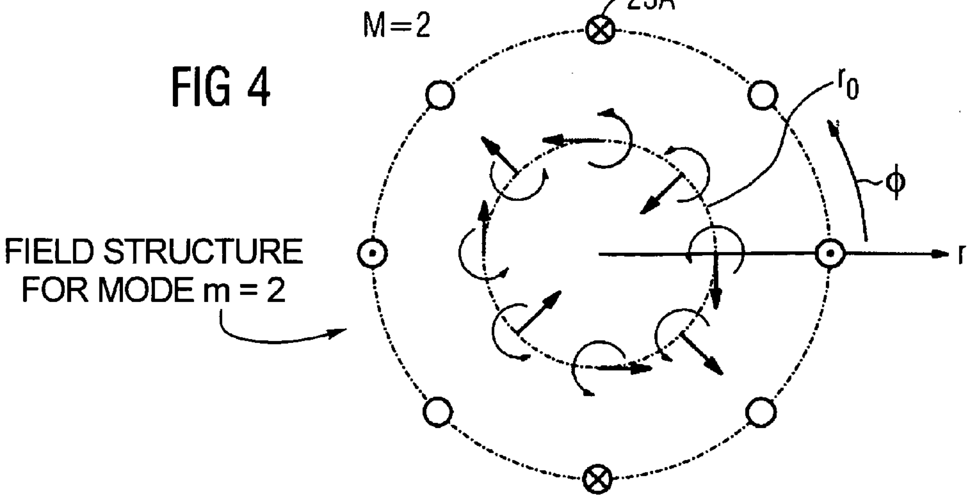
FIG. 4 illustrates the field structure of an auxiliary mode in the birdcage resonator according to FIG. 3.

FIG. 4 shows the field structure for the mode m=2. The currents in eight azimuthally equally-distributed rod-shaped antenna elements 23A are indicated for a point in time. The same polarization exists at all locations in the transmission volume, except for the limitation mentioned above. In the center, the magnetic field is zero and it increases linearly with increasing distance r from the center. For a radius $r_0$, the directions for field vectors are fixed at a point in time. Given a rotation by 360° around the center, the direction of the field vectors (m−1=2−1=1) rotates once. The direction for the mode m=3 analogously rotates twice, three times for the mode m=4, . . .

Figure 5:
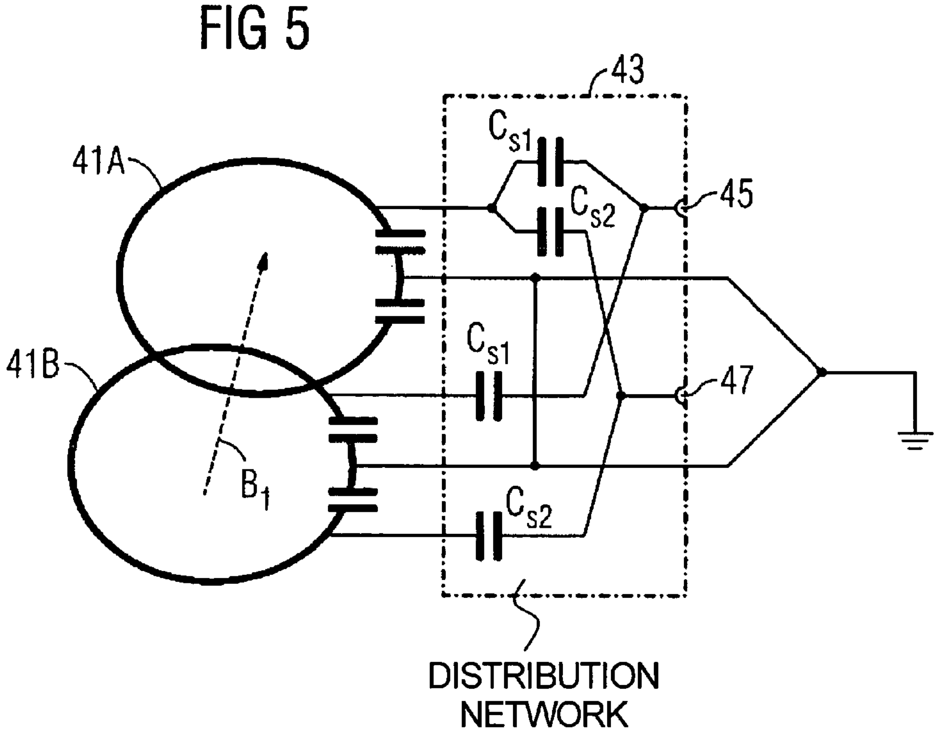
FIG. 5 schematically illustrates a further radio frequency transmitter arrangement according to the invention, with two loop antenna elements.
Figure 6:
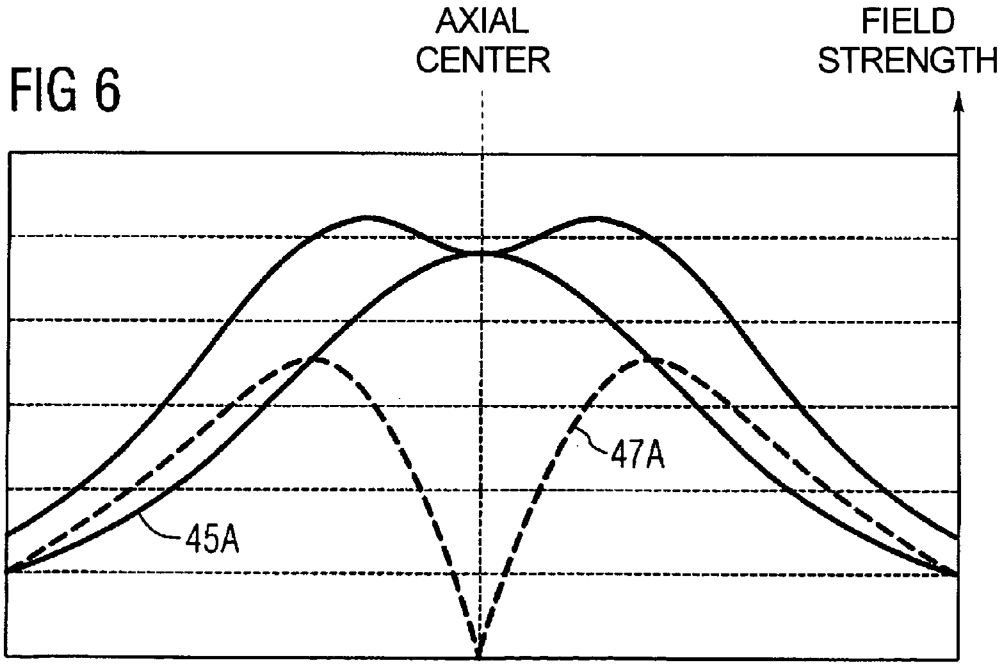
FIG. 6 shows the axial field distribution of the basic mode and of the auxiliary mode of the radio frequency transmitter arrangement of FIG. 4, FIG. 7 schematically illustrates an exemplary double-transmitter arrangement according to the invention.

In addition to the combination of modes that are subdivided according to azimuthal frequencies, a combination of, for example, "longitudinally more orthogonal" modes of longitudinally staggered antenna elements is also possible. Corresponding "longitudinal" modes are thereby generated as a basis for homogenization of the RF field. FIG. 5 shows an example for this in the form of a longitudinally-arranged two-element loop antenna array. This transmission-reception arrangement has two ring coils 41A, 41B that are supplied with radio frequency signals with the aid of a distribution network 43. Likewise orthogonal modes with equal (linear) polarization are thereby available via the distribution network 43 shown in FIG. 5. The radio frequency signal supplied to the upper input 45, connected to capacitors $C_{s1}$, is emitted in a mode known as the Helmholtz mode, with parallel currents in both directions, and corresponds to the basic mode. The associated field curve is shown by the curve 45A in FIG. 6. The transmission signal supplied to the lower input 47, connected to capacitors $C_{s2}$ generates what is known as a "counter-rotating current" mode with anti-parallel currents and corresponds to the first and only auxiliary mode. Its field curve is shown in FIG. 6 by the curve 47A. A possible superimposed field curve is also shown in FIG. 6 that exhibits a greater homogeneity over a larger central range.

Figure 7:
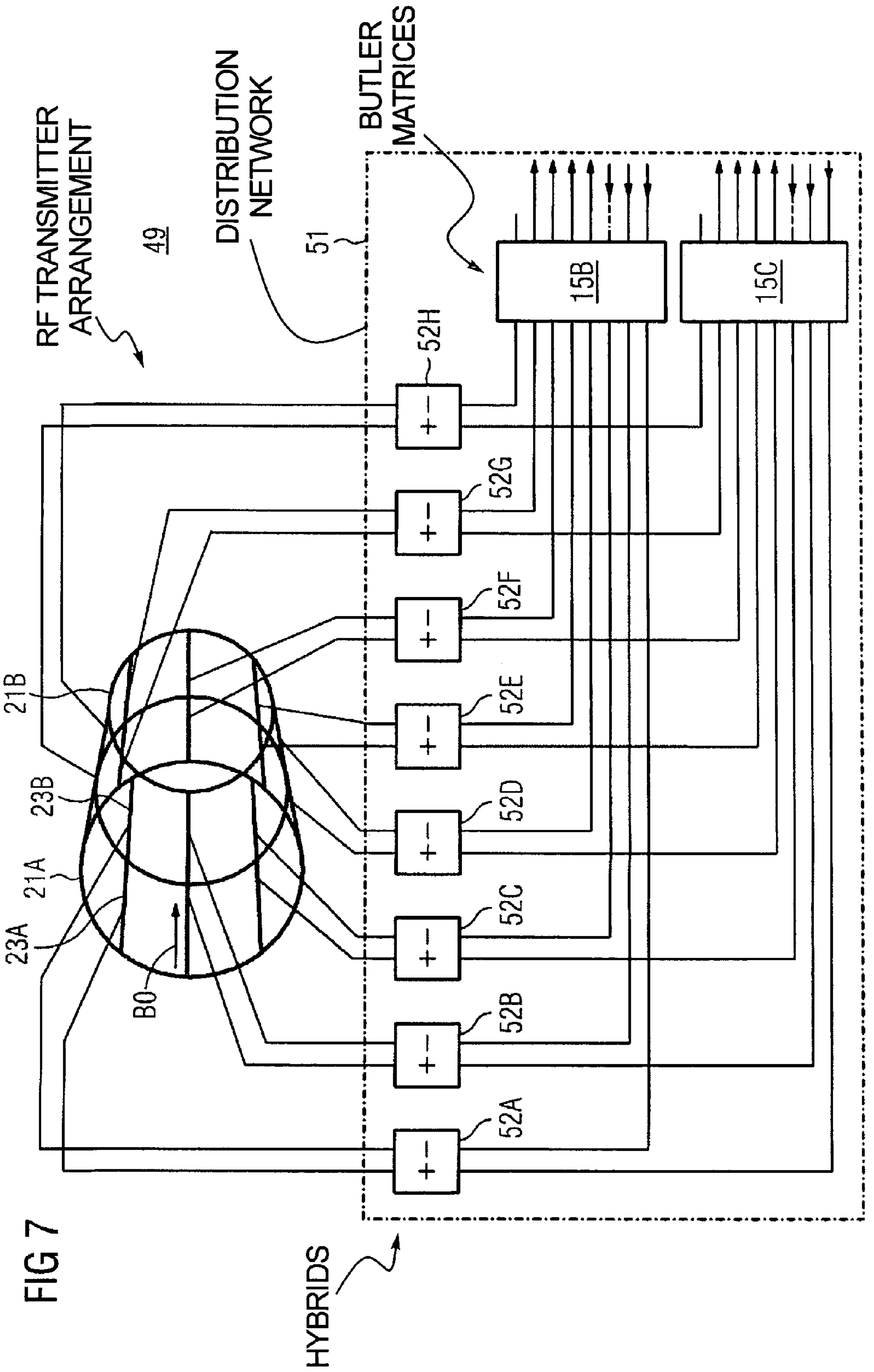

As an exemplary embodiment, FIG. 7 schematically shows a multiple radio frequency transmitter arrangement 49 that represents a combination of two radio frequency transmitter arrangements according to FIG. 3. Such a double transmitter arrangement is, with regard to its function, analogous to 2D Fourier transformation. B1 field inhomogeneities in the axial and in the radial direction of the birdcage resonator can be correspondingly compensated. The double radio frequency transmitter arrangement 49 comprises two axially adjacent (staggered) birdcage resonators 21A, 21B with eight antenna elements each. The totality of sixteen antenna elements of both birdcage resonators 21A, 21B are supplied with radio frequency signals by the distribution network 51. In addition to Butler matrices 15B, 15C that correspond to the Butler matrix 15A, the distribution network 51 comprises eight 180° hybrids 52A, . . . with two inputs and outputs per. . . . Each input is connected with each output of one of the Butler matrices 15B, 15C, and the outputs are respectively connected with a pair of antenna elements 23A, 23B arranged longitudinally in series. Such a distribution network 51 generates modes in pairs in a type of superimposed Helmholtz mode and "counter-rotating current" mode in (with the modes according to FIG. 3). With regard to the formation of the Helmholtz mode and the "counter-rotation current" mode, in the embodiment according to FIG. 7 the antenna elements are longitudinally arranged with regard to a basic magnetic field direction B0.

A further embodiment of a multiple transmitter arrangement is, for example, formed of four birdcage resonators. Eight eight-Butler matrices arranged transmission-side/reception-side cooperate with eight four-Butler matrices (corresponding to the 180° hybrids) for field optimization.

In the following, the use of an RF transmitter arrangement according to the invention as well as the method according to the invention for the determination of a setting parameter of an adjustment unit used in such an RF transmitter arrangement is described. The fields of all excitable modes are individually calibrated to determine optimal setting parameters. The spatially-distributed B1 field emitted in a mode n is given by the magnitude (amplitude) and phase at each location:

$$B1n(\mathrm{r})=An(\mathrm{r})\exp(i\phi n(\mathrm{r})).$$

An optimally homogenously effective B1 field should be generated via radiation of a number of modes weighted commonly in amplitude and/or phase.

The inventive method to determine a setting parameter, for a first mode (for the most part the basic mode), in addition to the spatially dependent distribution of B1, a spatial distribution of the influence of the T1 relaxation on the MR signals also is determined. This is then used in order to simply and quickly attain the B1 maps of the second and further modes (auxiliary mode) according to magnitude and relative phase. Implementing the T1 determination for only the basic mode and transferring it to higher auxiliary modes can be combined with all of the methods for B1 field determination that can be implemented for all modes that are T1 sensitive.

Figure 8:
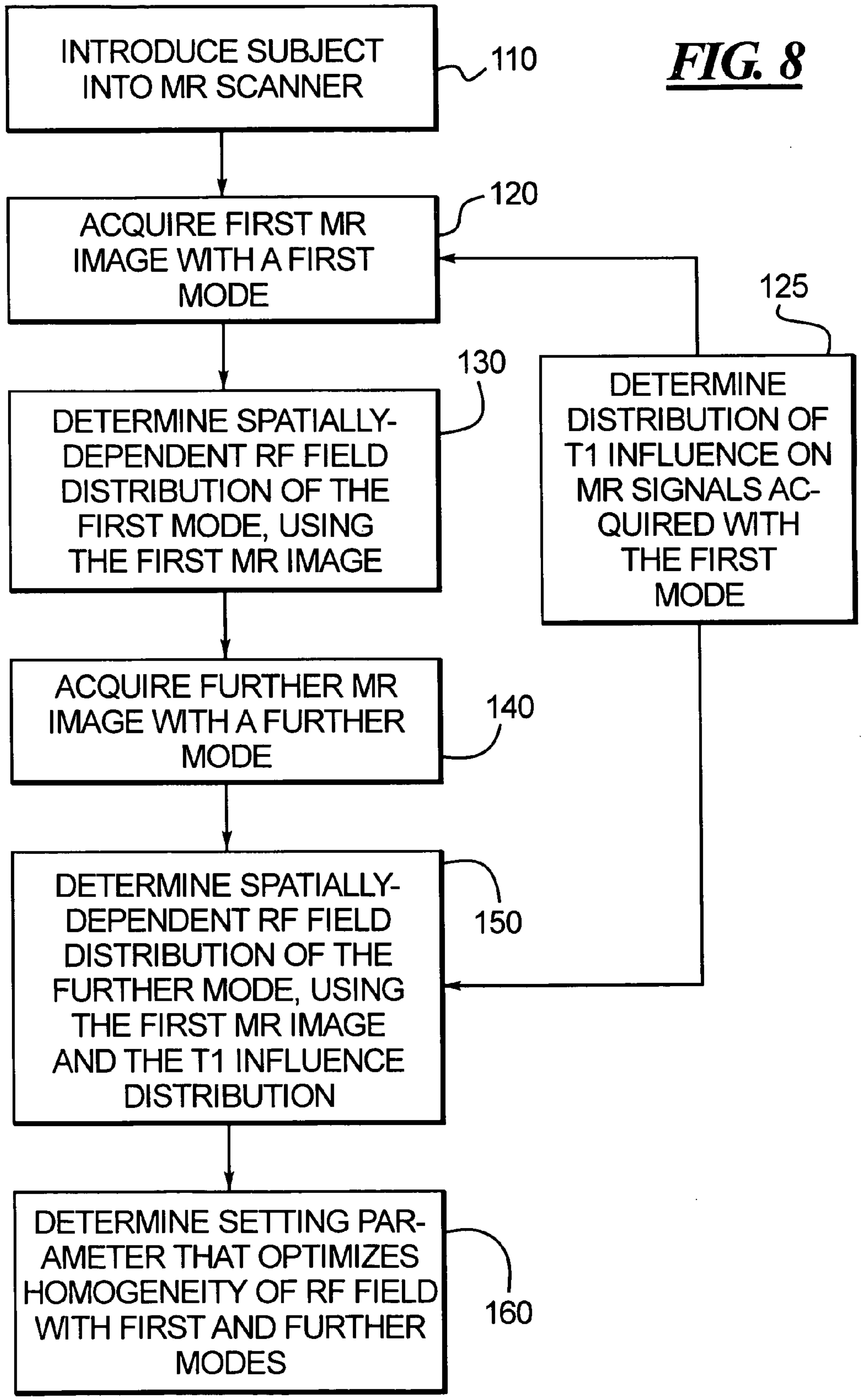
FIG. 8 is a flowchart of the inventive method to determine a setting parameter of an adjustment unit of a radio frequency transmitter arrangement.

The inventive method for the determination of a setting parameter includes the steps in the flowchart of FIG. 8. A T1-dependent measurement method has been assumed.

In a first step 110, an examination subject is introduced into transmission volume of a magnetic resonance apparatus. In a second step 120, a number of magnetic resonance images are subsequently acquired with a first mode. This occurs with a measurement protocol (pulse sequence) that exhibits an intrinsic T1 dependency, for example due to a time interval between spin preparation (for example inversion, saturation) and spin excitation. In step 125, a distribution of the influence of the T1 relaxation on the MR signals operating system is determined in the transmission volume with the measured MR signals for the first mode; for example a T1 map is created for the transmission volume. In step 130, a spatially dependent radio frequency field distribution of the first mode is determined from the image acquired in step 120.

In the following, a method to determine the RF field distribution is exemplarily described which could be used, for example, to determine the RF field distribution of the basic mode. In this method, a double-echo radio frequency pulse sequence is radiated via an RF antenna with a first excitation pulse and at least two following refocusing pulses to generate a first echo (for example a spin echo) and a subsequent second echo (for example a stimulated echo). At least the excitation pulse is radiated slice-selectively. A slice-selective radiation is achieved by emitting the excitation pulse with a specific shape (for example the shape of a sinc function) and a matching frequency, and moreover a matching gradient pulse is radiated simultaneously, such that the excitation pulse excites only the spins in the desired, defined slice. A first two-dimensional echo-image and second two-dimensional echo-image are then acquired with spatial resolution by radiation of suitable gradient pulses for phase and frequency coding in the excitation slice established by means of the slice-selectively radiated excitation pulse.

Such a "spatially resolved" measurement of the echo-images is possible with a method in which initially both echoes are measured via sampling of the time curve multiple times with m data points with n various amplitudes of the phase coding gradients. The result of this measurement is then a data matrix with m columns and n rows for each of the echoes (i.e. the spin echo and the stimulated echo) in the time domain (also called "k-space"). This matrix is individually, two-dimensionally Fourier-transformed for each echo. For each echo a real two-dimensional image with k−1 pixels is therewith obtained, whereby in general m=n=k=1 is set. Using the ratios of the amplitudes of the first and second echo images at the various locations, i.e. for each individual image pixel, the local flip angles are then measured at the appertaining locations. The flip angle, i.e. a flip angle distribution, consequently can be measured with spatial resolution within the layer by such a measurement.

The flip angle measured at a specific location is representative for the B1 field radiated at that location, with the dependency being given by the equation $$\alpha = \int_{t=0}^{\tau} \gamma \cdot B_1(t) \cdot dt$$

This means that arbitrarily conversion from a flip angle distribution into a B1 field distribution and vice versa can be done with the aid of this equation (given knowledge of the pulse used). The terms "flip angle distribution" and "B1 field distribution" or "radio frequency field distribution" are therefore normally synonymously used.

As explained above, the longitudinal relaxation time T1 influences the amplitudes ASTE of the stimulated echo signals STE and the amplitudes ASE of the spin-echo signal SE in different manner. This can lead to a systematic measurement error. In order to also minimize this influence of the relaxation time T1 as much as possible, or, respectively, in order to determine the distribution in step 125 of the influence of the T1 relaxation on the MR signals, a series of measurements is implemented with various desired flip angles (measurement flip angles). A common B1 map of the basic mode, freed of the influence of the relaxation time as much as possible, is then generated for each slice to be measured from the individual flip angle distributions or field distributions (also called B1 maps in the following) that are measured.

Figure 9:
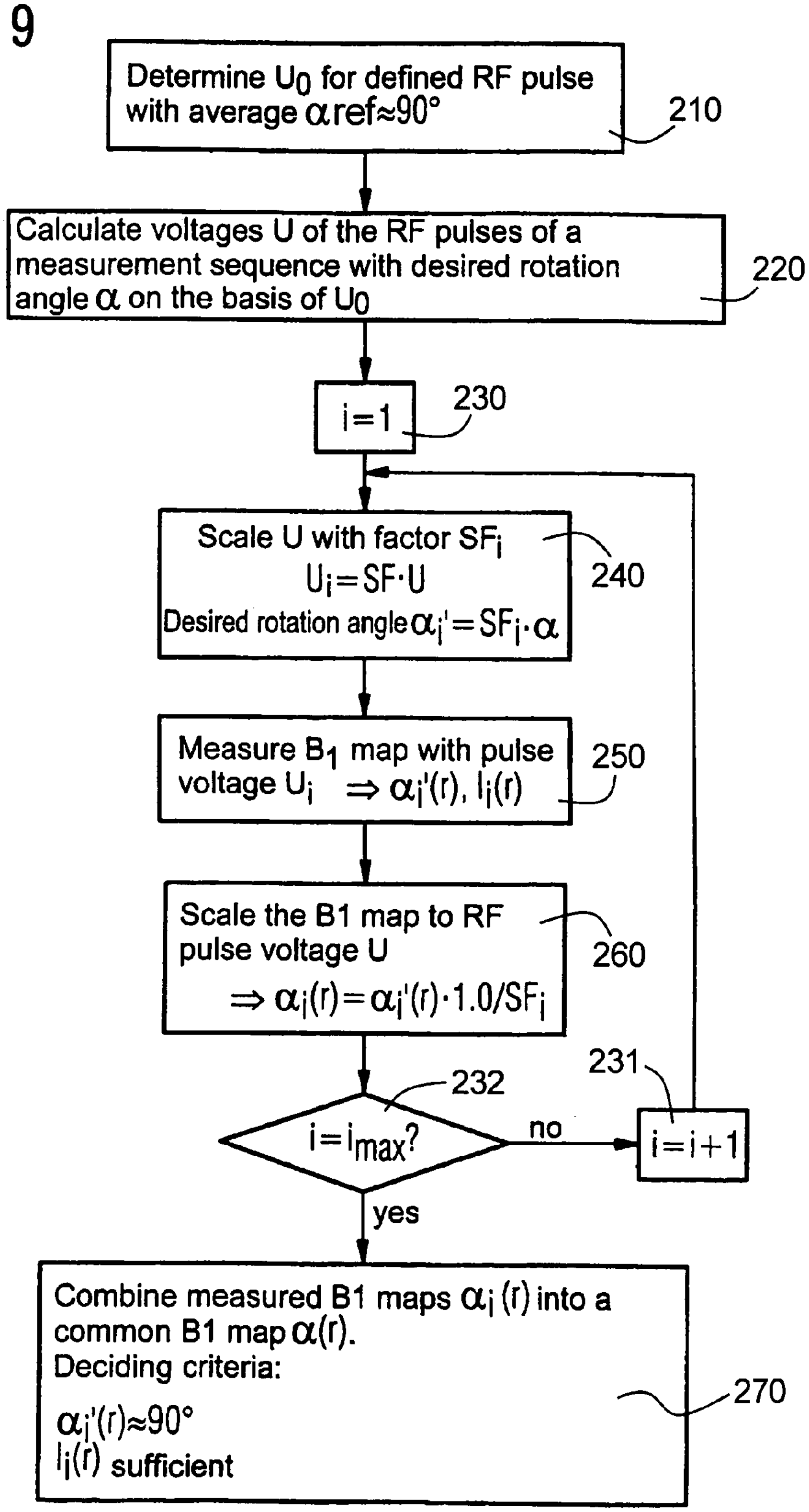
FIG. 9 is a flowchart of a correction method according to the invention, for the compensation of the T1 relaxation influence.
Figure 10:
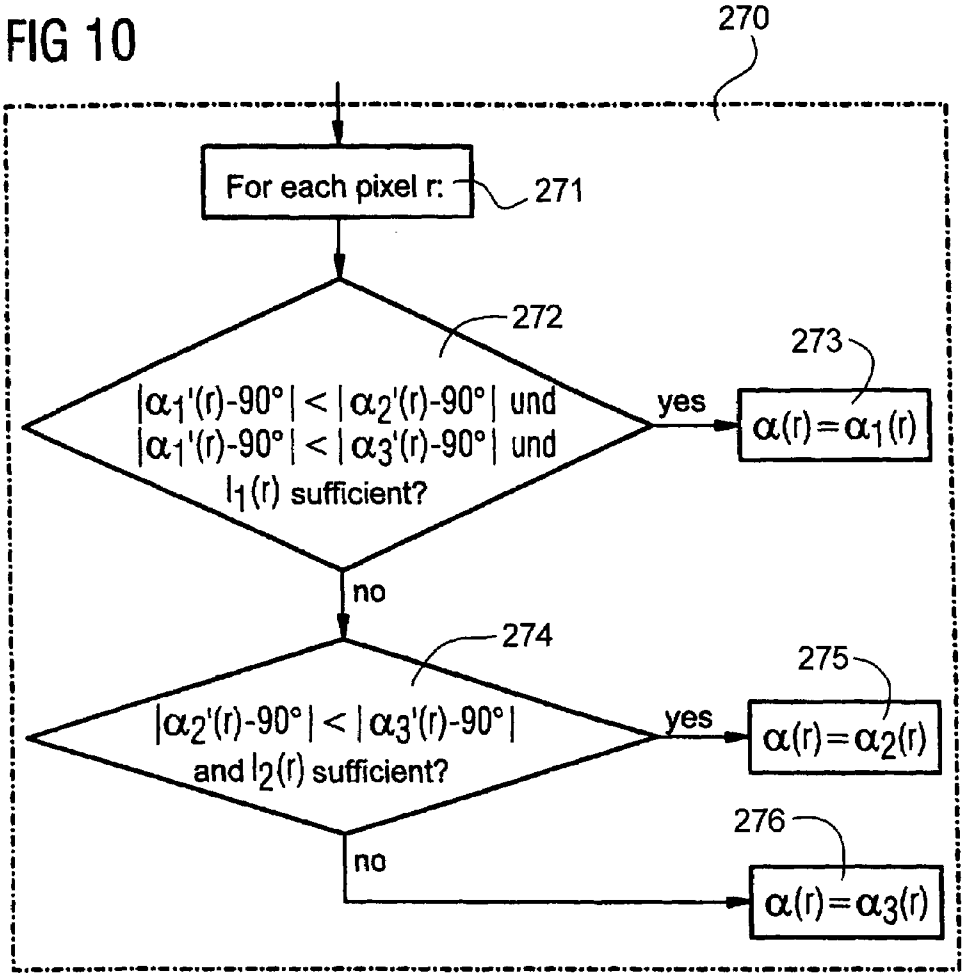
FIG. 10 is a more detailed schematic illustration of a variant of the last method step in FIG. 9.
Figure 11:
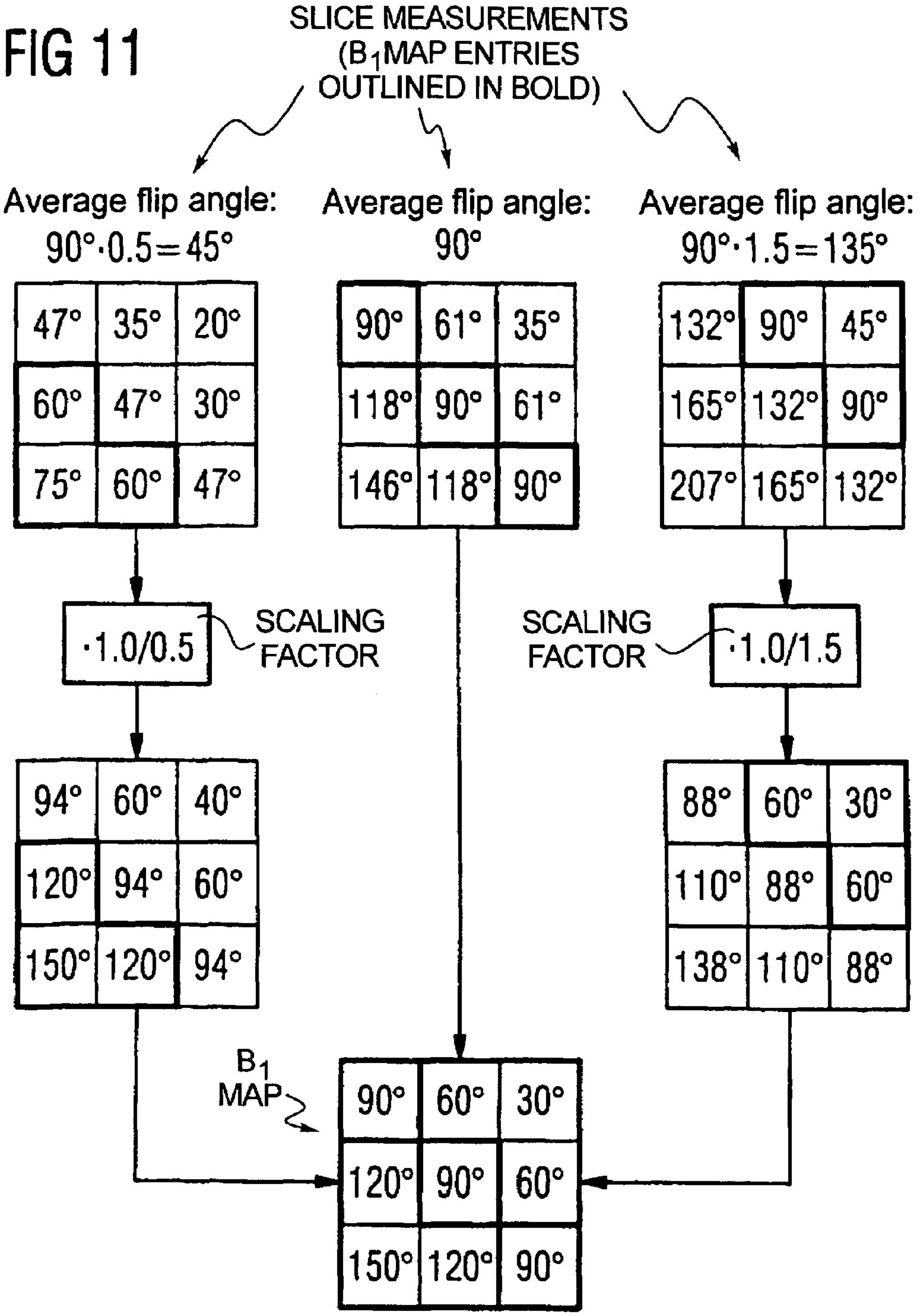
FIG. 11 is a schematic illustration of the combination of three measured, spatially resolved flip angle distributions in a combined distribution according to the variant of FIGS. 9 and 10.

An exemplary procedure to determine the distribution (step 125) of the influence of the T1 relaxation on the MR signals and the RF distribution is shown using flowcharts in FIGS. 9 through 11. FIG. 9 essentially describes the measurement event, FIG. 10 shows a possibility for combination of a B1 map from the various B1 maps measured for the same slice, and FIG. 11 illustrates an application of the process from FIG. 10.

In a measurement (data acquisition using a pulse sequence), according to FIG. 9 an estimated value U0 is initially determined in a first method step 210 for any RF pulse voltage with which an average desired flip angle α-desired of approximately 90° would be achieved in the considered volume with a defined radio frequency pulse. In a second step 220, the voltage U of the radio frequency pulses of the measurement sequence is then calculated with a desired flip angle α based on the estimated value U0, whereby in the simplest case a value of 90° can also be selected for α. Since the measurement sequence also operates with a number of RF pulses that can have various pulse amplitudes, the voltage or the desired flip angle is thereby suitably set for each pulse.

Multiple measurements with various measurement flip angles are subsequently implemented in a loop including a number of steps. In the flowchart in FIG. 9, the control variable is the variable i, which is initially set to 1 (Step 230) before the beginning of the loop and runs from 1 to i-max, for example given three measurements, until i−max=3.

In the loop, in a first step 240 the voltage U is initially scaled with a predetermined scaling factor SFi, i.e. the current voltage Ui=SFi·U to be used in this measurement is calculated. Since the flip angle is linearly dependent on the pulse voltage used, the current measurement flip angle is correspondingly αi'=SFi·α. The factor SFi is modified with each execution of the loop. Thus, for example, given a three-time measurement, a measurement initially could ensue with a factor SFi=0.5, meaning it is measured with one-half pulse voltage. The measurement flip angle of the first measurement is correspondingly 0.5·α. For example, a measurement is subsequently implemented in which the measurement flip angle αi' corresponds to the desired flip angle α=90°. For this, a scaling factor of 1.0 is selected. A third measurement is subsequently implemented with a scaling factor SFi=1.5. αi'=1.5·α is then correspondingly true for the measurement flip angle. All flip angles of the measurement, but at least any of the refocusing pulses, are thereby scaled with the selected factor.

In the following step 250, the measurement of the B1 map then ensues with the appertaining pulse voltage Ui, whereby the respective actual flip angle αi'(r) is measured at the location r with an intensity Ii(r). This B1 map is then in the next step 260 rescaled again to the original radio frequency pulse voltage U with which the desired flip angle α would be achieved, i.e. the measured flip angles are normalized to the desired flip angle α. This ensues by a translation of the values according to the equation αi(r)=αi'(r)·1.0/SFi.

A query of the control variable i then ensues at the end of the loop (step 232) in order to determine whether the maximum number of the measurements has been implemented. If this is not the case, in the next step (231) the control variable i is incremented and the next measurement is implemented.

Otherwise, in the subsequent step 270 the B1 maps, which respectively contain the corresponding flip angle αi(r) for each location (each pixel r), are merged into a common B1 map which contains at a specific pixel r a specific flip angle α(r) generated based on the individual αi(r).

A deciding criterion is that αi'(r), i.e. the actual measured flip angle at the respective location, is optimally close to 90°, and that moreover a sufficient signal intensity Ii(r) was present in the appertaining measurement. These criteria are used because the influence of the relaxation time T1 is in principle very low given flip angles in the range of 90°, and these flip angles consequently can be determined with particularly high precision. Since various measurement flip angles are used in the images, the regions in which the actually achieved real flip angles are close to 90° are naturally at a different locations in each of the images.

The combination of the B1 maps thus measured with various measurement flip angles allows the best measurement value with the lowest T1 influence is used at each pixel. This means a common B1 map largely freed from T1 influence is generated from, for example, three B1 maps in which, respectively, the measurement results in specific (but different) regions are adulterated by the relaxation time T1.

One possibility of this pixel-by-pixel combination is shown in FIG. 10. In FIG. 10, for simplicity only three different measurements are assumed. The method, however, can be implemented with only two measurements or be expanded to an arbitrary number of measurements.

In the flowchart of step 270 in FIG. 10, for each individual location or pixel r step 271, it is initially determined in step 272 whether the real flip angle α1'(r) measured in the first measurement is closer to 90° than the real flip angle α2'(r) measured in the second measurement and the real flip angle α3'(r) measured in the third measurement. Additionally it is tested whether the intensity I1(r) measured in the first measurement at this location is sufficient. If both conditions are satisfied, the correspondingly normalized flip angle α1(r) is assumed in the combined B1 map as the actual flip angle α(r) given at this location (step 273). If this is not the case, it is checked in step 274 whether the flip angle α2'(r) measured in the second measurement is closer to 90° than the flip angle α3'(r) measured in the third measurement, and whether the intensity I2(r) measured in the second measurement is sufficient. If this is the case, the correspondingly normalized flip angle α2(r) is used as the actual flip angle α(r) present at the appertaining location r (step 275). Otherwise, the correspondingly normalized value α3(r) from the third measurement is ultimately assumed (step 276).

In an alternative possibility for per-pixel combination, an average flip angle α(r) is determined as follows for each location:

$$\alpha(r) = W_0 \cdot \sum W_i(r)\alpha_i(r)$$

with $$W_0 = \frac{1}{\sum W_i(r)}$$

The precise calculation of weighting value $W_i(r)$ hereby ensues according to $$W_i(r) = \frac{I_i(r)}{\mathrm{Max}(I_1(r), I_2(r), I_3(r))} \cdot \left(1 \cdot \frac{|\alpha_i'(r) - 90°|}{90°}\right)$$

The weighting of the intensity thereby ensues on the maximum value of all intensities $I_1(r)$, $I_2(r)$, $I_3(r)$ measured at the same location r in the various measurements. For simplicity, the amplitude of the spin-echo image is assumed as intensity $I_i(r)$.

In this method, all flip angles $\alpha_i(r)$ measured and normalized in the various measurements are entered into the common B1 map with corresponding weighting.

The method corresponding to FIG. 10 is schematically shown again in FIG. 11. Each of the fields in the uppermost row of FIG. 11 thereby represents a measurement of 3×3 pixels in a slice.

The desired flip angle α is 90°. The measurement implemented with the corresponding voltage U is shown in the middle column.

Moreover, a measurement is shown in which the scaling factor SF1=0.5 and the measurement flip angle is correspondingly α1'=0.5·90°, i.e. 45°. This measurement is shown in the left column. In the third measurement, the scaling factor is SF3=1.5 and the measurement flip angle is α3'=135° (right column).

The original measurements are shown in each uppermost row. The regions that are later entered into the combined B1 map are respectively bordered with the thicker lines.

After the measurements, the measured B1 maps are, respectively, scaled corresponding to the previously selected scaling factor. The means that all measurement values of the first measurement are scaled with a factor 1.0/0.5. The B1 map shown in the second row of the left column is thereby generated. The third measurement with the measurement flip angle of 135° is likewise scaled with a scaling factor of 1.0/0.5. The map shown in the right column in the second row is thereby generated. Since the second measurement was generated with the (here predetermined) desired flip angle of 90°, here a scaling is superfluous. A selection of a desired flip angle of 90° and the implementation of a measurement with a measurement flip angle corresponding to the desired flip angle is shown for simplicity but is not absolutely necessary.

All three maps are combined with the shown method as shown in FIG. 11, such that ultimately an overall map (shown below in FIG. 11) is generated in which the influence of the relaxation time T1 is relatively low.

In particular the distribution of the influence of the T1 relaxation time on the MR signals can be determined in step 125 from this map and the preceding measurements.

This ensues, for example, as follows. The central context in which the dependency on T1 comes into play is the following with the above B1 measurement method:

$$A\_STE(r)*\exp(T/T1(r))/A\_SE(r)=\cos(phi(r))$$

A_STE(r) is the measured intensity of the image acquired from the stimulated echo at the location r; A_SE(r) is the same for the spin echo; T is a parameter, specific for the measurement sequence, that takes into account the different sensitivity of the images (acquired from spin-echo and stimulated-echo_ to the (tissue—, i.e. spatially-dependent) spin-grid relaxation time T1(r); and phi(r) is the rotation angle of the RF pulse at the location r.

The measurement is implemented for the basic mode with a number of pulse voltages (for example U1, U2=0.5*U1, U3=1.5*U1) that lead to different rotational angles (phi1(r), phi2(r)=0.5*phi1(r), phi3=1.5*phi1(r)). Each of these measurements generates a spin-echo image (A_SE1(r), A_SE2(r), A_SE3(r)) and a stimulated-echo image (A_STE1(r), A_STE2(r), A_STE3(r); the contrast is in all cases a spin density/T1/T2 mix contrast). The rotational angle distribution phi(r) can be calculated from this without knowledge of T1 via the specified combination of these images. For each location r a plurality of equations can not be compiled:

| | |
|---|---|
| exp(T/T1(r)) = cos(phi(r)) | A_SE1(r)/A_STE1(r) |
| exp(T/T1(r)) = cos(0.5 * phi(r)) | A_SE2(r)/A_STE2(r) |
| exp(T/T1(r)) = cos(1.5 * phi(r)) | A_SE3(r)/A_STE3(r) |

In principle, one equation is already sufficient in order to determine the T1(r) relevant for the measurement, but since more information is available anyway, it is natural to determine, for example, a (weighted) average value. Since T1(r) is now known in the central context assumed above, the measurement with only one pulse voltage U is sufficient for the determination of the auxiliary modes.

Naturally any other method that can determine a spatial distribution of T1 is also suitable for the application to the adjustment method. The method specified above can be advantageously applied to all T1-sensitive adjustment methods. An advantage in the double-echo adjustment method explained above is that no additional measurement effort is necessary the T1 distribution can be derived from only the results of the adjustment measurement with the basic mode.

Due to the fact that the basic mode transmitter essentially radiates over the entire examination area, the B1 field determination can be significantly shortened for the higher modes. In order to eliminate the influence of T1 on the measured B1 distribution according to the method, it is generally necessary as specified to assume and to suitably combine a number of images with various rotation angles for each transmitter element (for example N elements, K images=>K*N measurements). With the inventive approach, the measurement effort can be clearly reduced since, as shown, not just the spatial distribution of the B1 field but rather also the distribution of the influence of T1 on the measurement can be determined in the transmission volume from the images acquired for the basic mode of the antenna arrangement. This information can be used as correction parameters in the following N−1 measurements with the remaining transmission modes, such that here the acquisition of L<K images (in the ideal case L=1) is sufficient (K+(N−1)*L measurements).

This fast procedure is described in the steps 140 and following in FIG. 8. In the step 140 of FIG. 8, a further magnetic resonance image is acquired with the second mode. In step 150, a spatially dependent radio frequency field distribution of the second mode is subsequently determined with the aid of the first magnetic resonance image and the distribution of the influence of the T1 relaxation on the MR signals. At least one setting parameter is subsequently determined in step 160 by means of the radio frequency distribution, such that given simultaneous supply of the first and at least the second mode feed signal to the antenna unit, a radio frequency field is generated that is optimized in terms of its homogeneity.

To determine the optimal setting parameter, i.e. the amplitudes and phases of basic and/or auxiliary modes, it is necessary to measure the spatial distributions of the fields of each mode in terms of magnitude and phase beforehand.

Consideration of the influence of the T1 relaxation on magnetic resonance signals in the transmission volume is omitted for T1-independent methods. The method is correspondingly simplified in comparison with FIG. 8, since, for example, no step 125 to determine the distribution of the influence of the T1 relaxation on the MR signals in the transmission volume is necessary, and thus the determination of the spatially-dependent radio frequency field distributions (is not taken into account).

In fact, suitable 2D and 3D MR methods to measure B1 amplitude distribution are known (see above), but they inherently provide no information about the phase distributions. For the field synthesis, it is sufficient to measure only the relative phase (for example relative to the phase distribution of the B1 field of the basic mode). For this, one proceeds as follows: the RF excitation pulses of a measurement frequency (transmission signals) are individually transmitted in the mode to be examined and the MR signal for all modes is respectively received with the same reception configuration (for example, the birdcage resonator is used in the reception basic mode (FIG. 3: M=1). Although the reception configuration can likewise have a spatial distribution of the phase (in general different from that of the "transmission" basic mode (FIG. 3: M=7)), this is identical in each individual measurement and plays no role in the optimization since it can be added to the phase of the transmission field as a selected reference phase of the basic mode.

In the following, the field synthesis, i.e. the generation of an optimally homogenously acting B1 field, is briefly explained. The fields of all used modes superimpose, after individual scaling of the amplitude with the factor an and individual phase displacement by pn, into $B1(r)=\exp(i\phi 1(r))\ \Sigma n\ an\ An(r)\ \exp\ (i\ pn+\Delta\phi pn(r))$, with $\Delta\phi n(r)=\phi n(r)-\phi 1(r)$. For field homogenization it is valid to minimize the expression $\int dr\ (|B1(r)|-B1)^2$ for a predetermined value B1, with the measurement values An(r) and $\Delta\phi n(r)$ and the optimizations parameters an and pn that serve as setting parameters. If the measurement values on a discrete grid are known, $\int dr$ is substituted for $\Sigma r$. When the quality of the measurement values is spatially different (for example grid points in which no signal-giving material is present), the optimization should ensue weighted: $\int dr\ w\ (r)(|B1(r)|-B1)^2$. The weighting factor w(r) can be established, for example, on the basis of the local image brightness l(r) (for example self-weighting (w(r) proportional l(r)) or threshold (w(r) 1, in the case that l(r)>IS, w(r)=0 otherwise).

It is advantageous when the optimization can be directed toward a region selected by an operator. For example, after a test measurement the operator can spatially establish a region to be examined in the associated test acquisition. The optimization parameters are then determined such that the B1 field is homogenized in the selected region.

The inventive method determines the cause of the inhomogeneity and allows an optimized B1 field profile to be generated via an individual, automatic adjustment step for each examination subject (patient) without causing an additional measurement effort in the actual imaging sequence. Dependent on the type and structuring of the antenna unit, the image contrast can be optimally homogenized. This represents a significant improvement with a view toward future ultra-high field MR systems.

Although modifications and changes may be suggested by those skilled in the art, it is the intention of the inventors to embody within the patent warranted hereon all changes and modifications as reasonably and properly come within the scope of their contribution to the art.

We claim:

1. A radio frequency transmitter arrangement configured for a magnetic resonance apparatus comprising:

an antenna unit having an antenna structure configured to generate respective radio frequency fields in at least two orthogonal modes; and a distribution unit having an input configured to receive an RF transmission signal, said distribution unit dividing said RF transmission signal into at least two mode feed signals supplied to respective outputs of said distribution unit, to which said antenna unit is connected for generating said radio frequency fields in the respective orthogonal modes dependent on the respective mode feed signals at the outputs of said distribution unit;

said distribution unit comprising an adjustment unit connected between said input and one of said outputs that is configured for adjusting at least one of an amplitude and a phase of the mode feed signal at said one of said outputs, and a distributor that divides said RF transmission signal into a basic transmission signal and at least one auxiliary transmission signal, said basic transmission in said at least one auxiliary transmission signal being present at the respective outputs of the distribution unit;

said distributor comprising a distributor network, formed by a Butler Matrix enabling analog Fourier transformation, having at least two inputs connected to said input of said distributor unit and at least two outputs respectively connected to the outputs of said distributor unit, said distributor network generating the respective mode feed signals at the outputs thereof with a predetermined phase occupancy; and said antenna unit comprising a plurality of antenna units respectively connected to the outputs of said distributor network via the outputs of said distributor unit.

2. A radio frequency transmitter arrangement as claimed in claim 1 wherein said distribution unit comprises a power amplifier disposed in a signal path to amplify said RE transmission signal before division into said mode feed signals.

3. A radio frequency transmitter arrangement as claimed in claim 1 wherein said distribution unit comprises a power amplifier disposed in a signal path to amplify said RF transmission signal after division into said mode feed signals.

4. A radio frequency transmitter arrangement as claimed in claim 1 wherein said antenna unit is a birdcage resonator.

5. A radio frequency transmitter arrangement as claimed in claim 1 wherein said adjustment unit is connected between said input of said distribution unit and one of the inputs of said distributor network.

6. A radio frequency transmitter arrangement as claimed in claim 1 wherein said distribution network causes the respective mode feed signals of the basic transmission signal and the auxiliary transmission signal to generate the respective orthogonal modes.

7. A radio frequency transmitter arrangement as claimed in claim 1, wherein said distributor network causes the mode feed signals of said basic transmission signal and said auxiliary transmission signal to generate respective radio frequency fields that are circularly polarized in the same direction.

* * * * *